(12) United States Patent
Wang et al.

(10) Patent No.: US 12,072,239 B1
(45) Date of Patent: Aug. 27, 2024

(54) CIRCUITS AND METHODS FOR WAVELENGTH LOCKING OF OPTICAL RECEIVER WDM FILTERS

(71) Applicant: XILINX, INC., San Jose, CA (US)

(72) Inventors: Zhaowen Wang, Sunnyvale, CA (US); Mayank Raj, San Jose, CA (US); Chuan Xie, Fremont, CA (US); Sandeep Kumar, Cork (IE); Muqseed Mohammad, Singapore (SG); Sukruth Pattanagiri Giriyappa, Singapore (SG); Stanley Y. Chen, Cupertino, CA (US); Parag Upadhyaya, Los Gatos, CA (US); Yohan Frans, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 18/128,948

(22) Filed: Mar. 30, 2023

(51) Int. Cl.
*G01J 1/44* (2006.01)
*G01J 1/02* (2006.01)
*H03F 3/45* (2006.01)

(52) U.S. Cl.
CPC .............. *G01J 1/44* (2013.01); *G01J 1/0252* (2013.01); *H03F 3/45076* (2013.01); *G01J 2001/444* (2013.01); *G01J 2001/446* (2013.01)

(58) Field of Classification Search
CPC ...... G01J 1/44; G01J 1/0252; G01J 2001/446; H03F 3/45076
See application file for complete search history.

(56) References Cited

U.S. PATENT DOCUMENTS

| 11,005,572 B1 | 5/2021 | Chiang et al. | |
| 2006/0051010 A1* | 3/2006 | Chu | G02B 6/12007 385/5 |

OTHER PUBLICATIONS

K. Padmaraju et al., "Wavelength Locking and Thermally Stabilizing Microring Resonators Using Dithering Signals," IEEE Journal of Lightwave Technology, vol. 32, No. 3, Feb. 2014.

* cited by examiner

*Primary Examiner* — Georgia Y Epps
*Assistant Examiner* — Don J Williams
(74) *Attorney, Agent, or Firm* — Patterson + Sheridan, LLP

(57) ABSTRACT

An integrated circuit (IC) device includes a controller circuitry having an input coupled to a photodiode of an optoelectronic circuitry and an output coupled to a heater of the optoelectronic circuitry, the controller circuitry configured to determine a center frequency of the optoelectronic circuitry based on a shape of an input signal received from the photodiode, and provide a heater signal to the heater based on the shape of the input signal and the center frequency of the optoelectronic circuitry.

19 Claims, 10 Drawing Sheets

CIRCUITS AND METHODS FOR WAVELENGTH LOCKING OF OPTICAL RECEIVER WDM FILTERS

TECHNICAL FIELD

Examples of the present disclosure generally relate to a temperature-locked loop for optical elements having a temperature-dependent response.

BACKGROUND

Optical devices have been used for communications, such as over a fiber optic channel. Optical communications can implement low loss physical channels and high speeds. Like electrical devices, some optical devices can be used to process or filter signals, albeit optical signals. However, some optical devices can have features that are not present or not as significant in an electrical device. Further growth and implementation of optical devices in future technologies may require these features to be addressed.

SUMMARY

In one or more examples, an integrated circuit (IC) device includes a controller circuitry having an input coupled to a photodiode of an optoelectronic circuitry and an output coupled to a heater of the optoelectronic circuitry, the controller circuitry configured to determine a center frequency of the optoelectronic circuitry based on a shape of an input signal received from the photodiode, and provide a heater signal to the heater based on the shape of the input signal and the center frequency of the optoelectronic circuitry.

In one or more examples, a controller circuitry includes a control code circuitry. The control code circuitry includes a transimpedance (TIA) control circuitry having an input connected to a photodiode of an optoelectronic circuitry, and a heater circuitry having an input coupled to the TIA control circuitry and an output coupled to a heater of the optoelectronic circuitry, the heater circuitry configured to determine a center frequency of the optoelectronic circuitry and determine a shape of an input signal received from the photodiode based on a TIA control signal code provided by the TIA control circuitry, and maintain the center frequency of the optoelectronic circuitry within a calibration threshold.

In one or more examples a method for operating an integrated circuit device includes determining, by a controller circuitry having an input coupled to a photodiode of an optoelectronic circuitry and an output coupled to a heater of the optoelectronic circuitry, a center frequency of the optoelectronic circuitry based on a shape of an input signal received from the photodiode, and providing, by the controller circuitry, a heater signal to the heater based on the shape of the input signal and center frequency of the optoelectronic circuitry.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Examples described herein generally relate to devices and methods for a temperature-locked loop for optical elements having a temperature-dependent response. Generally, devices according to some examples include an electrical integrated circuit (IC) that includes an optoelectronic circuit and controller circuitry. The optoelectronic circuit includes optical channels, optical elements, a photodiode, and heaters. The optical element is configured to filter an optical signal into its corresponding receiving path, and the optical element has a temperature-dependent optical response. Example optical elements include a ring modulator, a double ring filter, a Mech-Zehnder interferometer (MZI), or the like. The photodiode is disposed relative to the optical element such that at least some of the optical signal passed through the optical element is incident on the photodiode. The heater is disposed proximate the optical element. The photodiode is connected to an input of the controller circuitry. An output of the controller circuitry is connected to an input of the heater. Generally, the controller circuitry is configured to control a temperature of the heater, and thereby the optical element, such that the optical element may have a center frequency or wavelength aligned with its input signal and provide a high-quality optical signal to the photodiode. However, due to process conditions and/or the ambient temperature and self-heating of the IC device, the center frequency of the optical element may drift from its proper center frequency. Embodiments herein relate to a controller circuitry that can detect a drift in the center frequency and calibrate the optical element to the proper temperature to align its center frequency with its input optical signal frequency.

Figure 1:
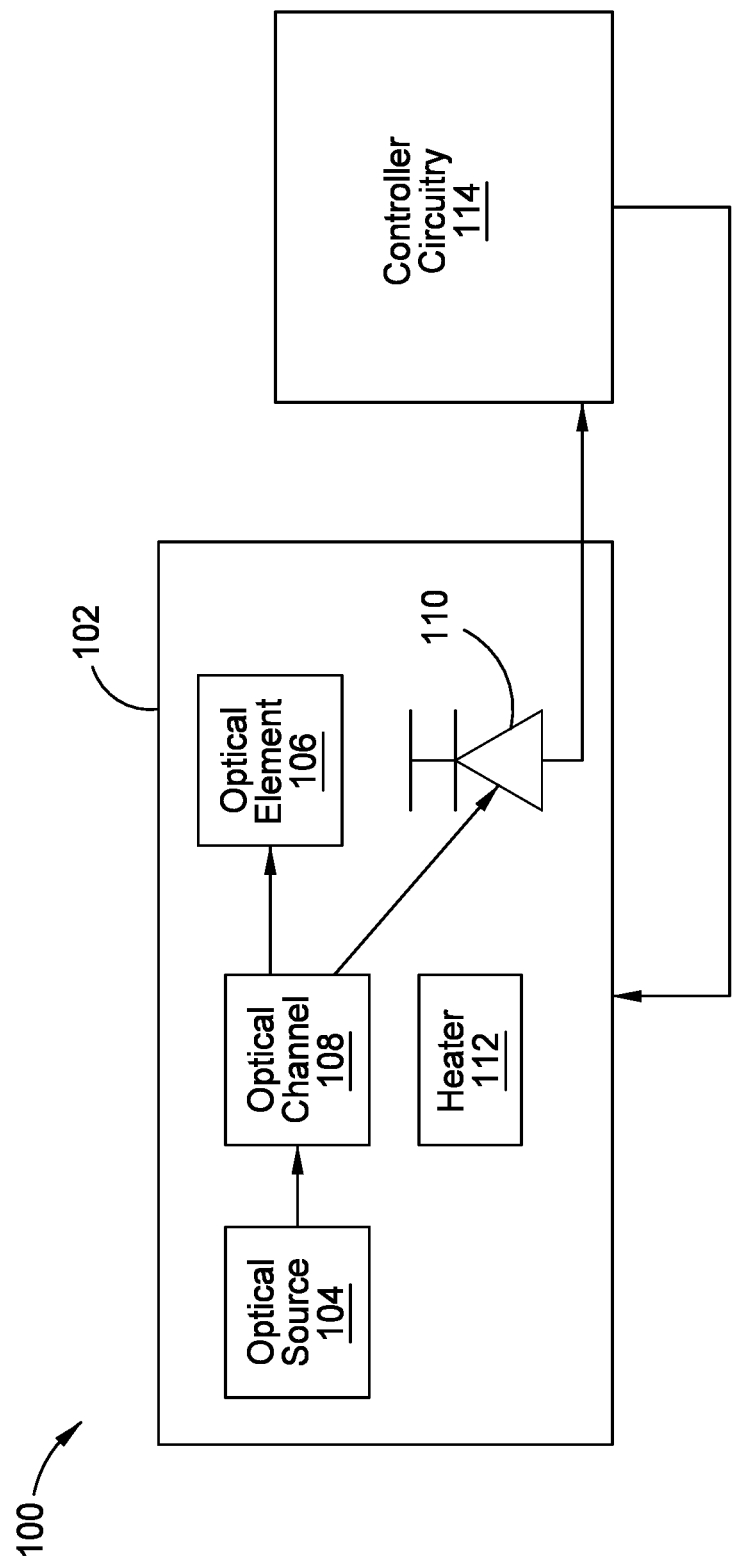
FIG. 1 illustrates an integrated circuit (IC) device according to one or more examples.

FIG. 1 illustrates an integrated circuit (IC) device 100 according to one or more examples. In one example, the IC device 100 includes an optoelectronic circuitry 102 and a controller circuitry 114. The optoelectronic circuitry 102 includes an optical source 104, an optical element 106, an optical channel 108, a photodiode 110 and a heater 112. The optical element 106 is any optical element configured to filter an optical signal and has a temperature-dependent optical response, such as a ring modulator, a double ring filter, a Mech-Zehnder interferometer (MZI), or the like. In some examples, the heater 112 is a resistor.

Generally, the controller circuitry 114 generates an output signal that is communicated to the optoelectronic circuitry 102. In one example, the output signal is a heater signal that changes the temperature of the heater 112. The optical source 104 generates an optical signal, and transmits the optical signal via the optical channel 108. The optical element 106 is coupled to the optical channel 108, and the optical channel 108 filters the optical signal within its passband from the optical channel 108 to its output. The photodiode 110 is disposed in optoelectronic circuitry 102 such that a portion of the optical signal output from the optical element 106 is incident on the photodiode 110. The photodiode 110 generates an input signal in response to the optical signal incident on the photodiode 110. In one example, the output signal of the photodiode 110 is an electrical current. The output of the photodiode 110 is coupled to the controller circuitry 114, and the controller circuitry 114 receives the input signal from the photodiode 110. The controller circuitry 114, in response to the input signal, outputs a heater signal to the heater 112 based on a proper center frequency of the input signal and the shape of the input signal. The heater 112 is connected to the controller circuitry 114 and is disposed in optoelectronic circuitry 102 such that the heater 112 is located proximate to the optical element 106. In response to the heater signal, the heater 112 can control a temperature of the optical element 106. The optical element 106 has an optical response that varies based on a temperature of the optical element 106. Stated differently, the center frequency of the optical elements 106 may become mismatched due to process variations and/or temperature drift. Therefore, the controller circuitry 114, via the heater signal, is able to control the temperature of the heater 112 to lock the center frequency of the input signal to the proper center frequency.

Figure 2:
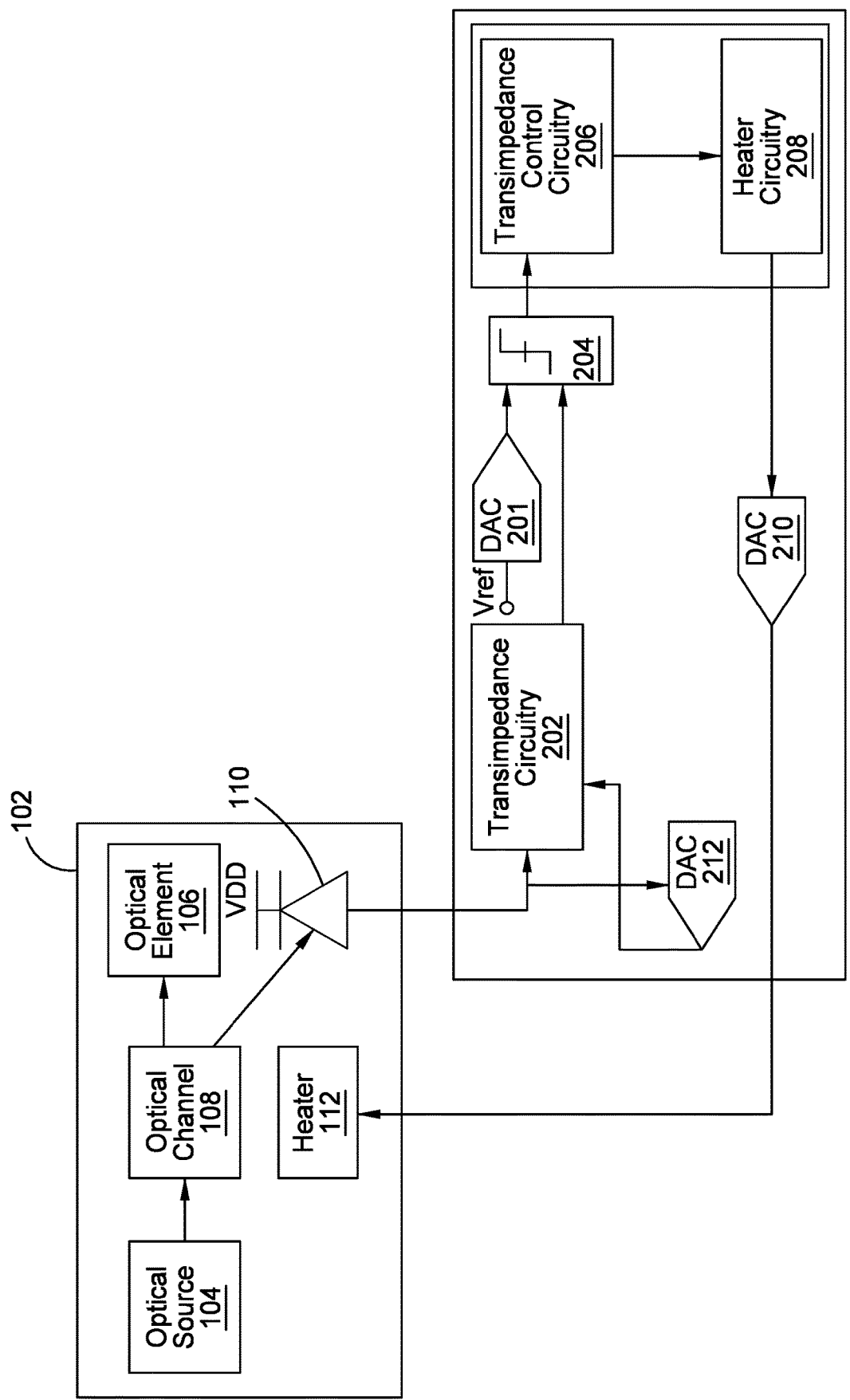
FIG. 2 is a more detailed schematic of the schematic of FIG. 1 according to one or more examples

FIG. 2 is a more detailed schematic of the schematic of FIG. 1 according to one or more examples. The controller circuitry 114 includes a digital-to-analog converter (DAC) 201, a transimpedance (TIA) circuitry 202, a slicer circuitry 204, a control code circuitry 207, a DAC 210, and a DAC 212. In one or more examples, the TIA circuitry 202 includes a current source, a resistor, a TIA amplifier, and a controllable current source (not shown).

A cathode of the photodiode 110 is electrically connected to a first power supply node (e.g., a VDD node), and an anode of the photodiode 110 is coupled to the TIA circuitry 202, which can further be an input of the controller circuitry 114. In one example, the current source of the TIA circuitry 202 is electrically connected between the first power supply node (e.g., the VDD node) and the input of the TIA circuitry 202. The current source can be or include a current mirror biased by a static current such that the current source is configured to provide a static or constant current. The controllable current source of the TIA circuitry 202 is connected between the input of the TIA circuitry 202 and a second power supply node (e.g., a ground node).

A first input of the slicer circuitry 204 is connected to the output of the TIA circuitry 202. A second input of the slicer circuitry 204 is connected to an output of a DAC 201. An output of the slicer circuitry 204 is connected to an input of the control code circuitry 207. In some examples, the slicer circuitry 204 is a comparator. An input of the DAC 201 can be electrically coupled to, e.g., a memory element (such as electrical fuses (eFuses)) that stores a digital value corresponding to a reference voltage (Vref). The reference voltage Vref can be, in some examples, VDD/2.

In one example, the control code circuitry 207 includes a TIA control circuitry 206 and a heater circuitry 208. In one example, the output of the TIA control circuitry 206 is connected to an input of the heater circuitry 208 and a DAC 212. The heater circuitry 208 output is connected to an input of a DAC 210. The TIA control circuitry 206 outputs a TIA control signal to the DAC 212 and the heater circuitry 208. The heater circuitry 208 outputs a heater control signal to the DAC 210 based on the TIA control signal. In one example, the control code circuitry 207 includes at least one output connected the TIA circuitry 202 (not shown). In one example, the control code circuitry 207 is connected to the controllable current source. In another example, an output of the DAC 212 is connected to a bias voltage node of the controllable current source.

An output of the DAC 210 is connected to an input of the heater 112. In one example, the heater 112 includes or is a resistor. The DAC provides a heater signal to the heater based on the heater control signal.

In operation, the photodiode 110 generates a current in response to the optical signal incident on the photodiode 110. The current generated by the photodiode 110 is received by the controller circuitry 114 at the TIA circuitry 202 as an input signal. The TIA circuitry 202 generates a voltage signal at an output of the TIA circuitry 202 stage based on the input signal. The slicer circuitry 204 generates a logical "1" or a logical "0" based on whether the voltage signal is greater than a reference voltage output by the DAC 201. The DAC 201 generates the reference voltage based on, e.g., the digital value stored in a memory element (not shown) communicatively coupled to the input node of the DAC 201. The reference voltage can be a static voltage, and hence, in some examples, the digital value stored in the memory element can be static. The TIA control circuitry 206 samples the logical "1"s and logical "0"s generated by the slicer circuitry 204 and outputs a TIA control signal code based on the logical "1"s and logical "0"s.

The heater circuitry 208 generates heater control signal code based on the TIA control signal code. The heater circuitry 208 increases or decreases the heater control signal code based on the TIA control signal code. Stated differently, the heater circuitry 208 increases and decreases the heater control signal code transmitted to the DAC 210. The changes in the heater control signal code causes the DAC 210 to change the heater signal to increase or decrease the temperature provided by the heater 112 to maintain the center frequency of the input signal within a calibration threshold.

The TIA control signal code responsively adjusts the DC component of the input signal provided to the DAC 212 such that the output of the slicer circuitry 204 has almost an equal amount of 1's and 0's over an observing window. The DC component of the input signal consists of the static current of the photodiode 110, and an extra DC current caused by the optical signal from the optical element 106. The optical signal strength and the extra DC current caused by the optical signal from the optical element 106 depends on the frequency response and the input signal frequency of the optical element 106. Therefore, the DC current strength reflects the shape of the optical element 106 frequency response and the frequency mismatch between center frequency and input frequency of the optical element 106. Embodiments herein, are related to the control code circuitry 207 changing the heater control signal code based on a shape on the DC input signal from the photodiode 110 and a center frequency of the input signal to maintain the alignment between the center frequency of optical element 106 and the optical signal provided from optical source 104.

Figure 3:
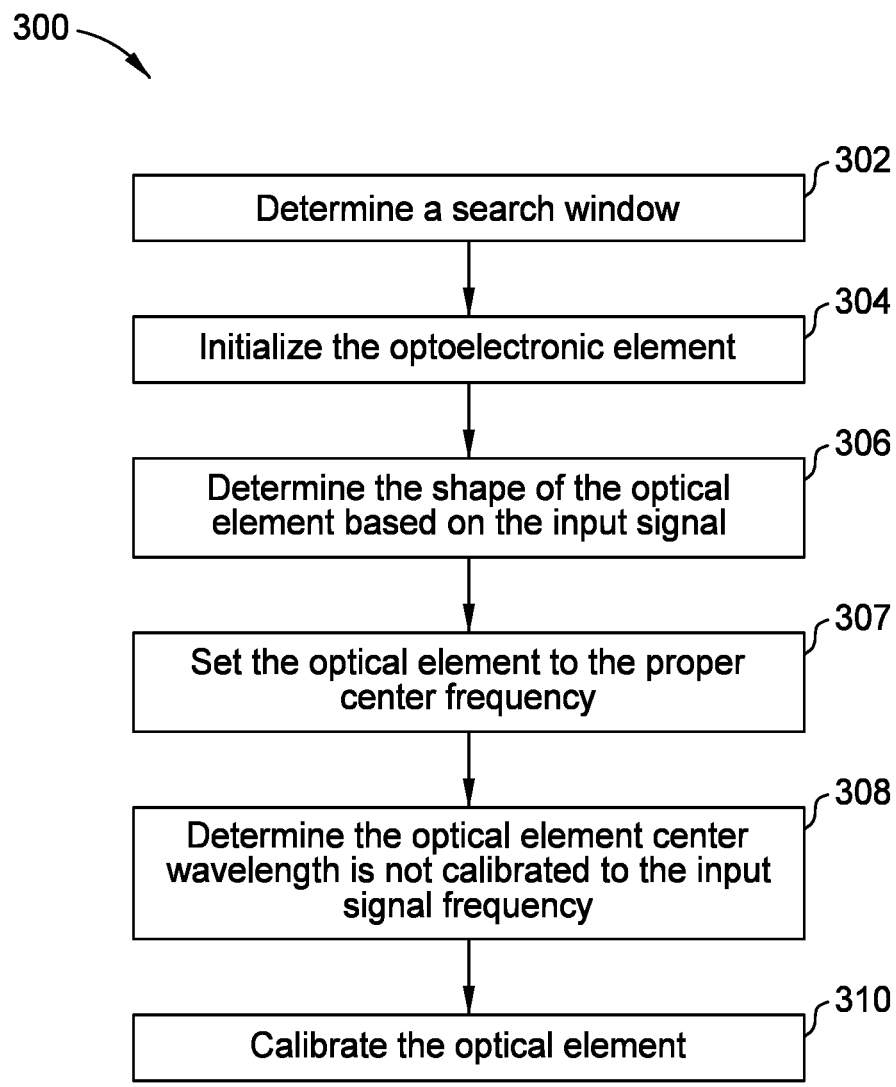
FIG. 3 illustrates a flow diagram illustrating a method for calibrating an input signal from an optoelectronic circuit according to one or more examples.

FIG. 3 illustrates a flow diagram illustrating a method 300 for calibrating an input signal from an optoelectronic circuitry 102 according to one or more examples. FIG. 3 is described with respect to FIG. 2.

At step 302, the control code circuitry 207 determines a search window. In one example, the search is a frequency search range such as 200 GHz. The search window may have a lower frequency bound and an upper frequency bound. The search window is determined by the heater circuitry 208 by comparing the TIA control signal code to a search window threshold at a lower bound of the search window. If the TIA control code at the lower bound of the search window is above the search window threshold, the heater circuitry 208 will decrease the lower the upper bounds of the search window until the TIA control code at the lower bound of the search window is below the search window threshold. If the TIA control code is below the search range threshold when the search window is initialized, the search window is valid and does not have to be adjusted.

Figure 4:
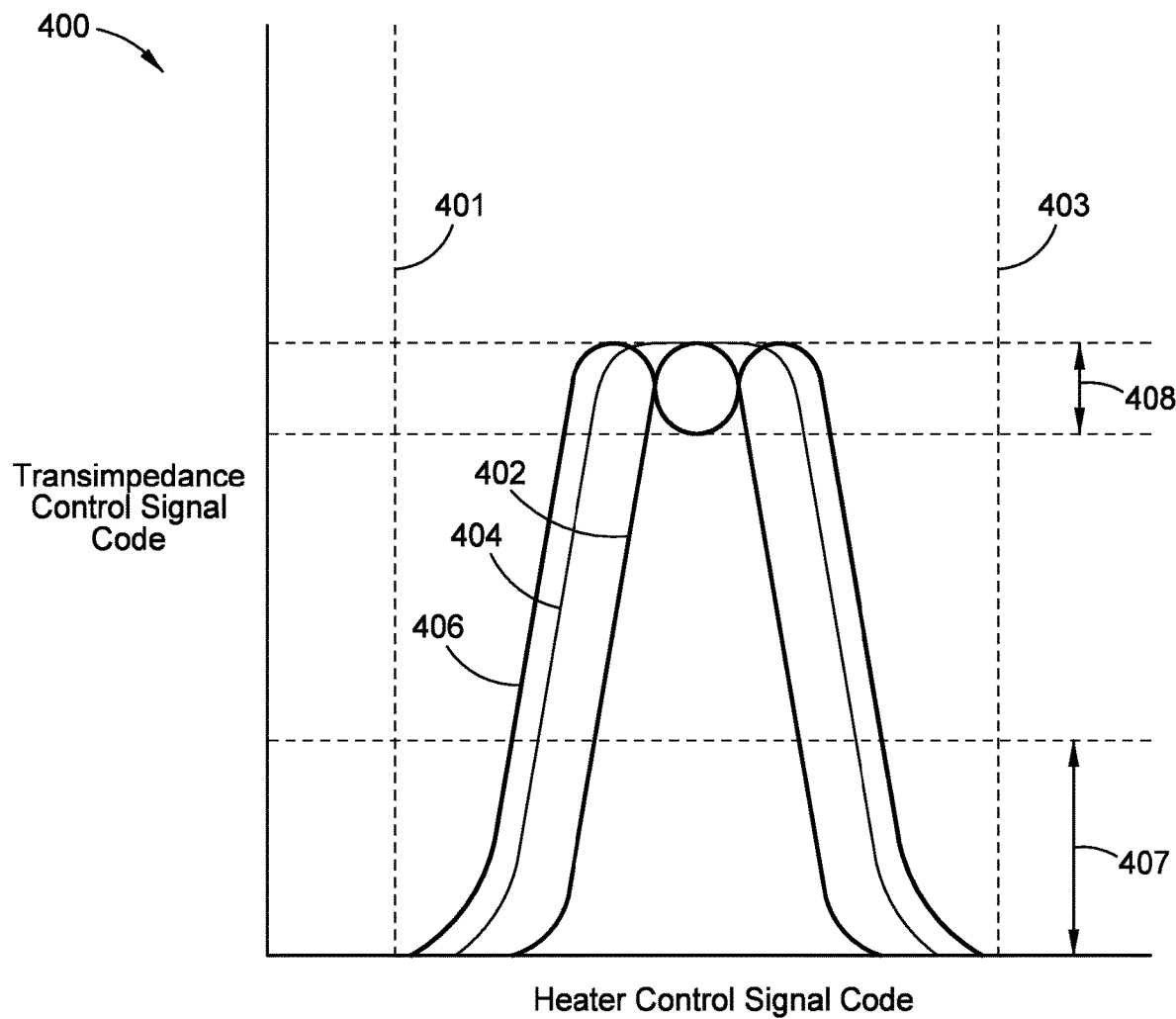
FIG. 4 illustrates a graph of input signals according to one or more examples.

At step 304, the control code circuitry 207 initializes the optical element 106. The heater circuitry 208 sweeps the heater control signal code from the lower bound frequency of the search window to the upper bound frequency of the search window. While the heater control signal code is swept, the heater circuitry 208 tracks how the TIA control signal code changes. Specifically, the heater circuitry 208 sweeps the heater control signal code supplied to DAC 210 from the lower bound of the frequency window to the upper bound of the frequency window, and the heater circuitry 208 tracks the TIA control signal code output by the TIA control circuitry 206. The TIA control circuitry 206 outputs the TIA control signal code based on the number of logical "1's" and logical "0's" captured from the slicer circuitry 204. This allows the heater circuitry 208 to track how the TIA control signal changes as the heater control signal is swept. The heater circuitry 208 visualizes the input signal as a graph, as shown in FIG. 4. The input signal is graphed from the lower bound of the search window 401 to the upper bound of the search window 403. The heater circuitry 208 visualizes the input signal as a graph 400 with the heater control signal code as the x-axis and the TIA control signal code as the y-axis. If the TIA control signal code never increases (is never greater than) a minimum TIA control signal code threshold 407, the heater circuitry 208 outputs a missing channel flag and the method returns to step 304. If the control code circuitry 207 determines that the TIA control signal code exceeds the minimum TIA control signal code threshold 407, the heater circuitry 208 determines the heater control signal code(s) that correspond to the maximum TIA control signal code(s) within the search window. The heater circuitry 208 may determine one or more maximum TIA control signal codes within the search window.

At step 306, the control code circuitry 207 determines the shape of the input signal. The input signal corresponds to the frequency response of optical element 106. The shape of the input signal may be determined, at least in part, based on the quantity of maximum(s) in the TIA signal control code in the search window TIA signal control code that surround the maximums(s). As illustrated in FIG. 4, if the heater circuitry 208 determines that there is one maximum TIA control signal code, the heater circuitry 208 determines that the shape of the input signal is convex, as illustrated by input signal 402, or that the shape of the input signal is flat as illustrated by input signal 404. On the other hand in the heater circuitry 208 determines there are two maximum TIA control signal codes within the search window, the heater circuitry 208 determines that the input signal has a concave shape, as illustrated by input signal 406. Based on the shape of the input signal, the heater circuitry 208 stores the center frequency of the input signal as the proper center frequency, stores the heater control signal code and TIA DAC code corresponding to the proper center frequency and the maximum(s).

At step 307, the optical element 106 is set to the proper center frequency. The heater circuitry 208 outputs the stored heater control signal code corresponding to the proper center frequency. Because the input signal corresponds to the frequency response of the optical element 106 the stored center frequency of the input signal also corresponds to the proper center frequency of the optical element 106. Stated differently, the optical element 106 is initially calibrated to the frequency of the optical signal generated by the optical source 104.

At step 308, the control code circuitry 207 determines that the optical element 106 center wavelength is not calibrated to the frequency of the optical signal generated by the optical source 104. Stated differently, the heater circuitry 208 compares the current TIA control signal code with a predetermined calibration threshold 408. For flat and convex cases, if the current TIA control signal code is less than the TIA control signal code corresponding to the proper center frequency minus the calibration threshold 408, the optical element 106 is not calibrated and the method continues to step 310. For concave cases, if the TIA control signal code is less than the TIA control code corresponding to the proper center frequency minus the calibration threshold 408, or greater than the TIA control code corresponding to the proper center frequency plus the calibration threshold 408 the method continues to step 310. The calibration threshold 408 may be set to 0 for continuous tuning, or set to a value greater 0 for trigger-typing tuning. The method does not continue to step 310 unless the heater circuitry 208 determines that the optical element 106 needs calibration.

At step 310, the control code circuitry 207 calibrates the optical element 106. Stated differently the heater circuitry 208 changes the heater control signal code based on the shape of the input signal, the current value of the TIA control signal code, and the calibration threshold 408. Advantageously, if the TIA control signal code changes based on a change in ambient temperature, the heater circuitry 208 updates the heater control signal code, which changes the heat output of heater 112 to maintain the center frequency such that the TIA control signal code variation is within (i.e. above) the calibration threshold 408. This will also be described in more detail below.

Figure 5:
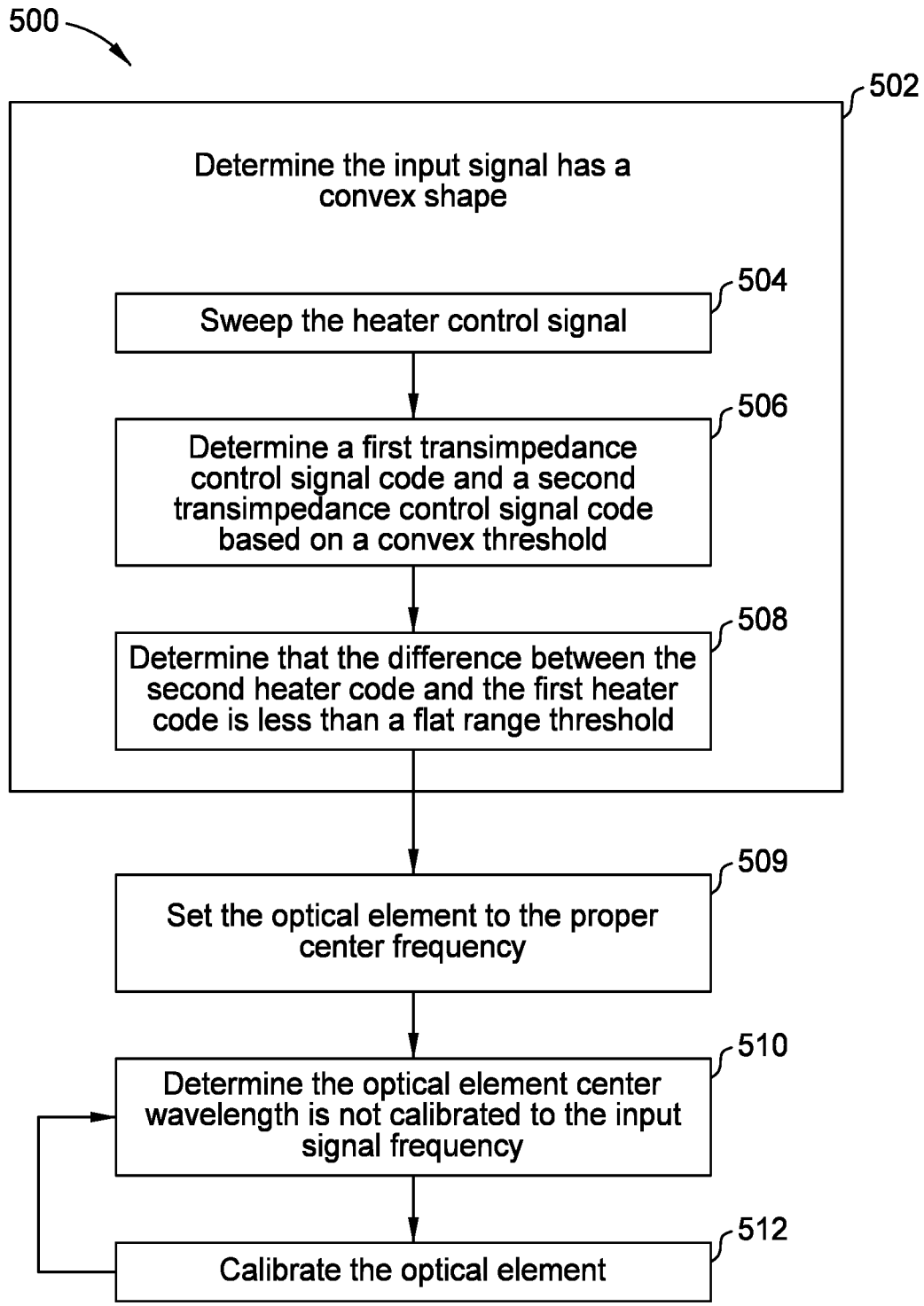
FIG. 5 illustrates a flow diagram illustrating a method for a calibrating an optical element having a convex frequency response according to one or more examples.
Figure 6:
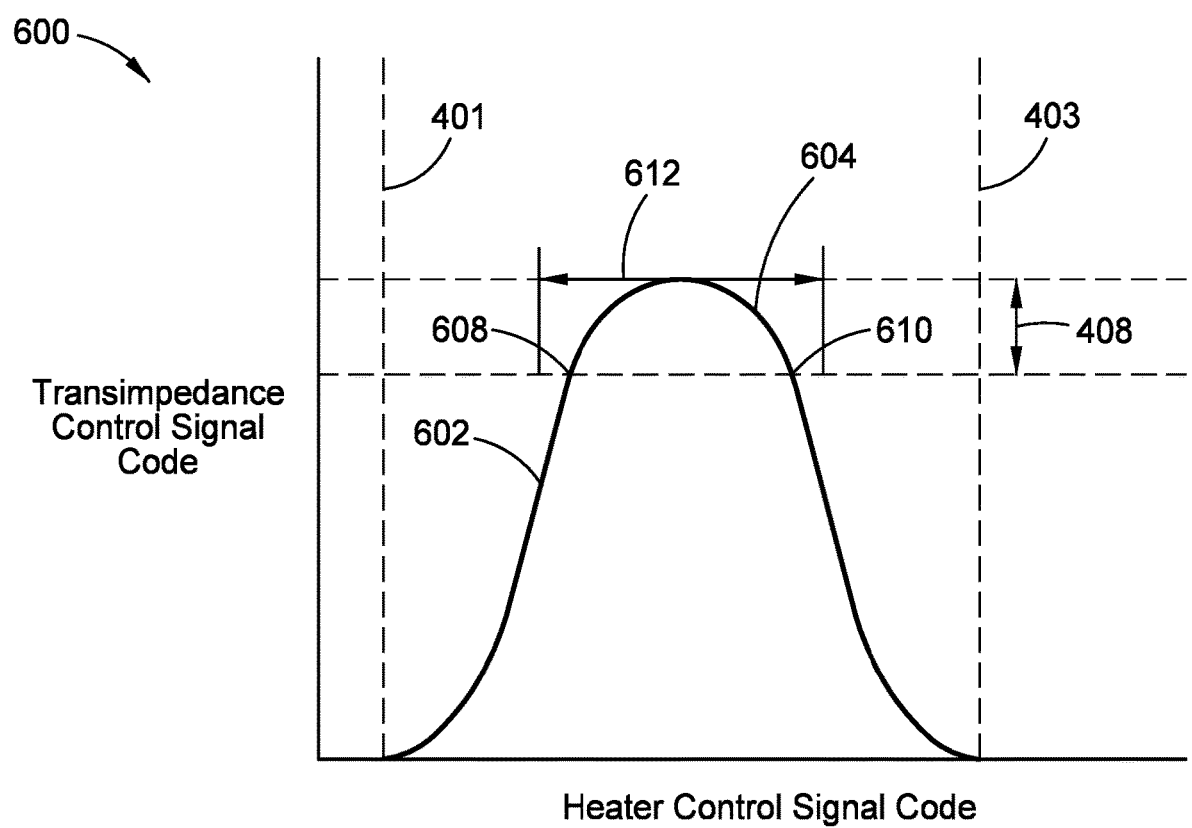
FIG. 6 illustrates a graph of an example input signal having a convex shape according to one or more examples.

FIG. 5 illustrates a flow diagram illustrating a method 500 for a calibrating optical element 106 having a convex frequency response according to one or more examples. The DC component of input signal received by the controller circuitry 114 has a corresponding convex response to that of optical element 106. FIG. 6 illustrates a graph 600 of an example input signal 602 having a convex shape according to one or more examples.

At step 502, the control code circuitry 207 determines that the input signal 602 has a convex shape. In one example determining, by the control code circuitry 207 that the input signal 207 has a convex shape includes steps 504-508.

At step 504, the heater circuitry 208 sweeps the heater control signal (step 304). The heater circuitry 208 determines the TIA control signal code includes one maximum TIA control signal code 604 within the search window. The heater circuitry 208 stores the maximum TIA control signal code 604 and the corresponding maximum heater control signal code.

At step 506, the control code circuitry 207 determines a first TIA control signal code 608 and a second TIA control signal code 610 based on the calibration threshold 408. In one example, the heater circuitry 208 determines the first TIA control signal code 608 by changing the heater control signal code in a first direction, such as the decreasing direction (or the increasing direction). The first TIA control signal code 608 is equal to the maximum TIA control signal code 604 minus the calibration threshold 408. The second TIA control signal code 610 is also equal to the maximum TIA control signal code 604 minus the calibration threshold 408. The heater circuitry 208 determines a first heater control signal code corresponding to the first TIA control signal code 608 by changing the heater control signal code until the TIA control signal code reaches the first TIA control signal code 608. In the illustrated example, the heater circuitry 208 decreases the heater control signal code unit the first TIA control signal code 608 is reached. In another example, the heater circuitry may increase the TIA control signal code until the first TIA control signal code 608 is reached. The heater circuitry 208 determines a second heater control signal code corresponding to the second TIA control signal code 610 by changing the heater control signal code in the opposite direction used to determine the first TIA control signal code 608 until the TIA control signal code reaches second TIA control signal code 610.

Figure 8:
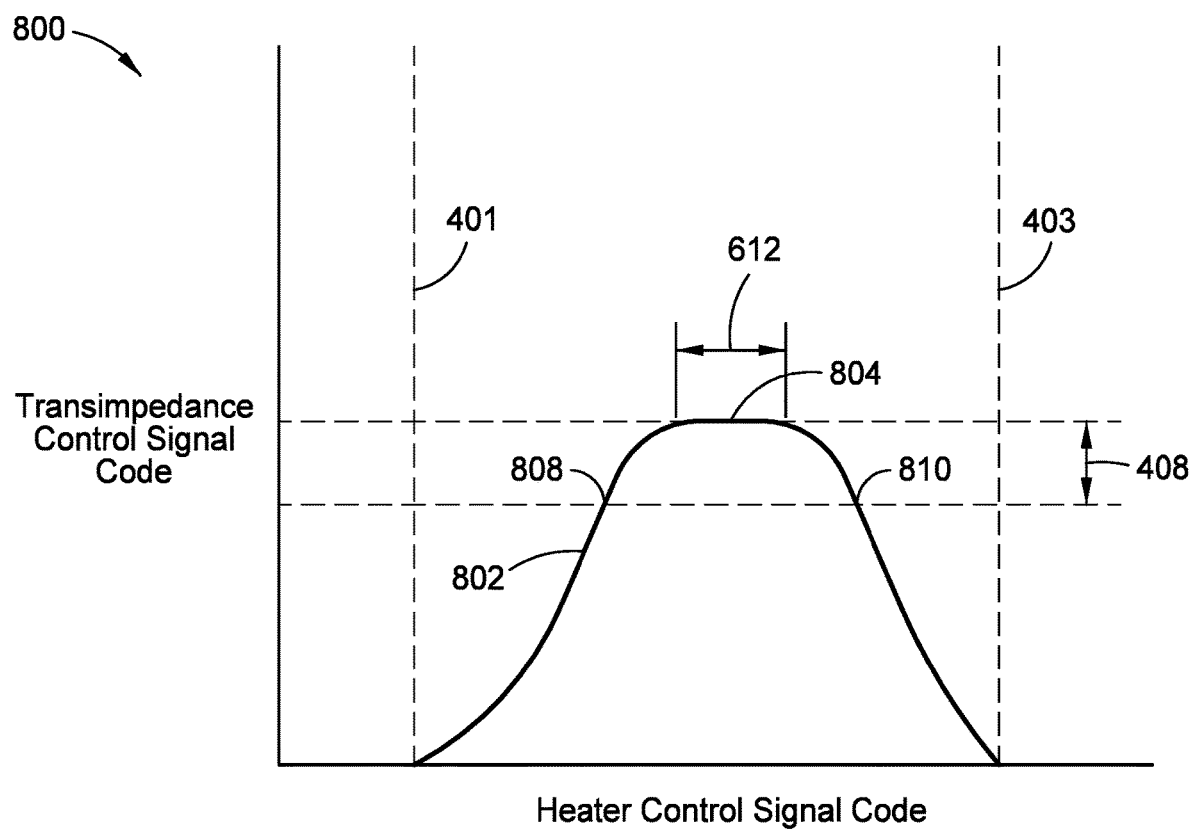
FIG. 8 illustrates a graph of an example input signal having a flat shape according to one or more examples.

At step 508, the control code circuitry 207 (the heater circuitry 208) determines that the difference between the second heater control signal code and the first heater control signal code is less than a flat range threshold 612. If the difference between the second heater control signal code and the first heater control signal code is less than the flat range threshold 612, the input signal 602 has a convex shape. If the difference between the second heater control signal code and the first heater control signal code is greater than the calibration threshold 606, the input signal has a flat shape (FIG. 8).

At step 509, the optical element 106 is set to the proper center frequency (step 307). The heater circuitry 208 sets the heater control signal code to the stored maximum heater control signal code that corresponds to the maximum TIA control signal code 604. Because the input signal corresponds to the frequency response of the optical element 106, the stored maximum heater control signal code also corresponds to the proper center frequency of the optical element 106. Stated differently, the optical element 106 is initially calibrated to the frequency of the optical signal generated by the optical source 104.

At step 510, the control code circuitry 207 determines the optical element 106 center wavelength is not calibrated to the frequency of the optical signal generated by the optical source 104 (step 308).

At step 512, the control code circuitry 207 calibrates the optical element 106. The heater circuitry 208 finds the maximum TIA control signal code 604 by changing (increasing or decreasing) the heater control signal code in the direction that the TIA control signal code increases until the TIA control signal code returns to the maximum TIA control signal code 604. Once the TIA control signal returns to the maximum TIA control signal code 604, the method returns to step 510.

Figure 7:
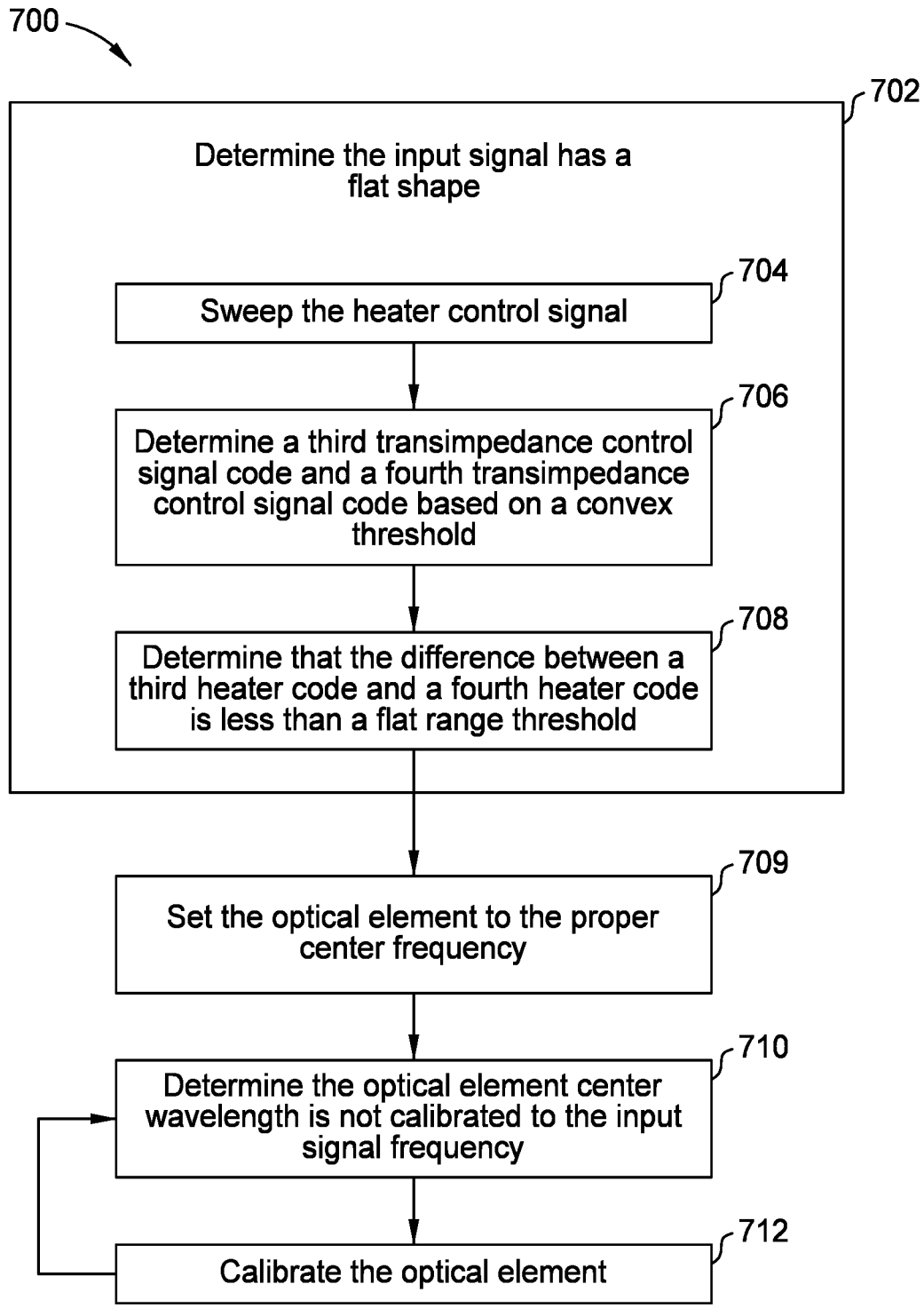
FIG. 7 illustrates a flow diagram illustrating a method for calibrating an optical element having a flat shaped frequency response according to one or more examples.

FIG. 7 illustrates a flow diagram illustrating a method 700 for calibrating an optical element 106 having a flat shaped frequency response according to one or more examples. In this case, the optical element 106 and the input signal received by the controller circuitry 114 have corresponding flat frequency responses. FIG. 8 illustrates a graph 800 of an example input signal 802 having a flat shape according to one or more examples.

At step 702, the control code circuitry 207 determines that the input signal 802 has a flat shape. In one example determining, by the control code circuitry 207, that the input signal 207 has a flat shape includes steps 704-708.

At step 704, the heater circuitry 208 sweeps the heater control signal (step 304). The heater circuitry 208 determines the TIA control code includes one maximum TIA control signal code 804 within the search window. The heater circuitry 208 stores the maximum TIA control signal code 804 and the maximum heater control signal code corresponding to the maximum TIA control signal code 804.

At step 706, the control code circuitry 207 determines a third TIA control signal code 808 and a fourth TIA control signal code 810 based on the calibration threshold 408. In one example, the heater circuitry 208 determines the third TIA control signal code 808 by changing the heater control signal code in a first direction, such as the decreasing direction (or the increasing direction). The first TIA control signal code 608 is equal to the maximum TIA control signal code 804 minus the calibration threshold 408. The fourth TIA control signal code 810 is also equal to the maximum TIA control signal code 804 minus the calibration threshold 408. The heater circuitry 208 determines a third heater control signal code corresponding to the third TIA control signal code 808 by changing the heater control signal code until the TIA control signal code reaches the third TIA control signal code 808. In the illustrated example, the heater circuitry 208 decreases the heater control signal code until the third TIA control signal code 808 is reached. In another example, the heater circuitry 208 may increase the TIA control signal code until the third TIA control signal code 808 is reached. The heater circuitry 208 determines a fourth heater control signal code corresponding to the fourth TIA control signal code 810 by changing the heater control signal code in the opposite direction used to determine the third TIA control signal code 808 until the TIA control signal code reaches fourth TIA control signal code 810.

At step 708, the control code circuitry 207 (the heater circuitry 208) determines that the difference between the fourth heater control signal code and the third heater control signal code is greater than a flat range threshold 612. If the difference between the fourth heater control signal code and the third heater control signal code is greater than the flat range threshold 612, the input signal 802 has a flat shape. If the difference between the fourth heater control signal code and the third heater control signal code is less than the calibration threshold 606, the input signal has a convex shape (FIG. 6).

At step 709, the optical element 106 is set to the proper center frequency (step 307). The heater circuitry 208 sets the heater control signal code to the stored maximum heater control signal code that corresponds to the maximum TIA control signal code 804. Because the input signal corresponds to the frequency response of the optical element 106, the stored maximum heater control signal code also corresponds to the proper center frequency of the optical element 106. Stated differently, the optical element 106 is initially calibrated to the frequency of the optical signal generated by the optical source 104.

At step 710, the control code circuitry 207 determines the optical element 106 center wavelength is not calibrated to the frequency of the optical signal generated by the optical source 104 (step 308). Once the control code circuitry 207 determines calibration is need, the method moves onto step 712.

At step 712, the control code circuitry 207 calibrates the optical element. The control code circuitry 207 finds the maximum TIA control signal code 804. The heater circuitry 208 finds the maximum TIA control signal code 804 by changing (increasing or decreasing) the heater control signal code in the direction that the TIA control signal code increases until the TIA control signal code reaches either the third TIA control signal code 808 or the fourth TIA control signal code 810. Then once the third TIA control signal code 808 or the fourth TIA control signal code 810 is reached, the heater circuitry 208 adds or subtracts half of the third heater control signal code plus the fourth heater control signal code to the current heater control signal code. For example, if the heater circuitry 208 finds the third TIA control signal code 808, the heater circuitry 208 will add half of third heater control signal code plus the fourth heater control signal code to the third heater control signal code to return to the maximum TIA control signal code 804. On the other hand, if the heater circuitry 208 finds the fourth TIA control signal code 810, the heater circuitry 208 will add half of third heater control signal code plus the fourth heater control signal code to the fourth heater control signal code to return to the maximum TIA control signal code 804. Once the TIA control signal returns to the maximum TIA control signal code 804, the method returns to step 710.

Figure 9:
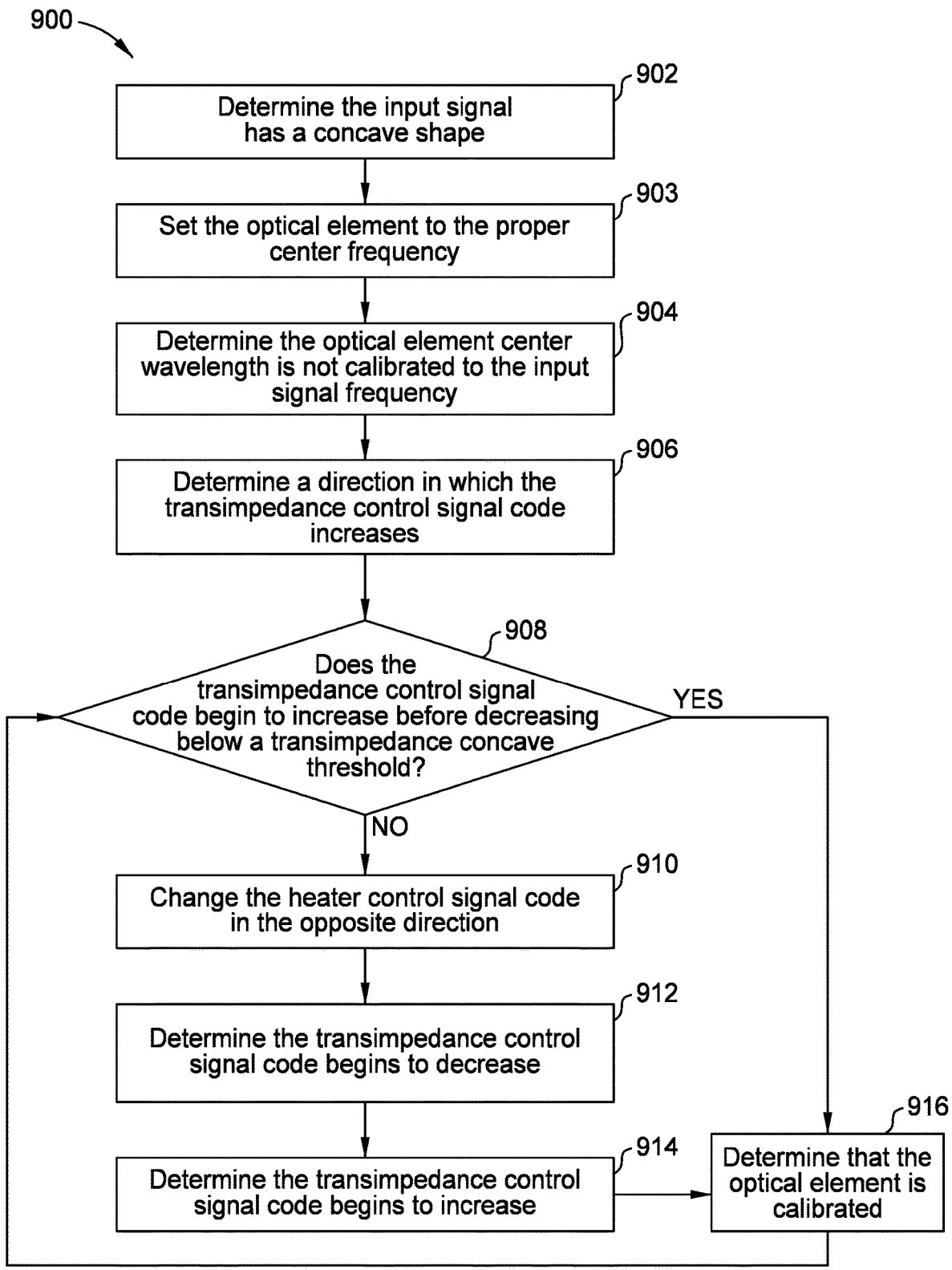
FIG. 9 illustrates a flow diagram illustrating a method for calibrating an optical element having a concave shaped frequency response according to one or more examples.
Figure 10:
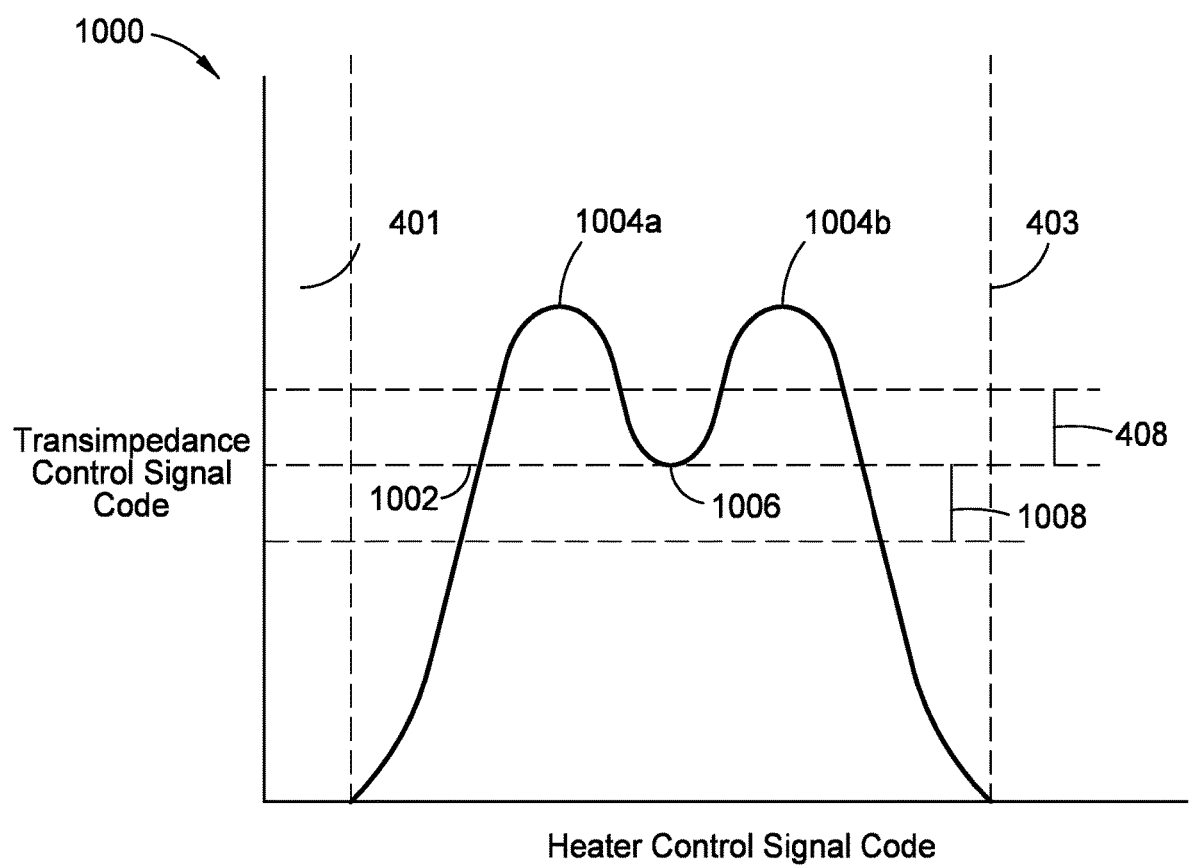
FIG. 10 illustrates a graph of an example input signal having a concave shape according to one or more examples.

FIG. 9 illustrates a flow diagram illustrating a method 900 for calibrating an optical element 106 having concave shaped frequency response according to one or more examples. In this case, the optical element 106 and the input signal received by the controller circuitry 114 have corresponding concave frequency responses. FIG. 10 illustrates a graph 1000 of an example input signal 1002 according to one or more examples.

At step 902, the control code circuitry 207 determines that the input signal 1002 has a concave shape. The heater circuitry 208 determines that the input signal 1002 has a concave shape by determining two maximums, a first maximum TIA control signal code 1004a and a second maximum TIA control signal code 1004b. After the heater circuitry 208 determines the two maximums, the heater circuitry determines a local minimum TIA control signal code 1006 that corresponds to the center frequency. The heater circuitry 208 stores the local minimum TIA control signal code 1006 and the corresponding local minimum heater control signal code.

At step 903, the optical element 106 is set to the proper center frequency (step 307). The heater circuitry 208 sets the heater control signal code to the local minimum heater control signal code. Because the input signal corresponds to the frequency response of the optical element 106, the local minimum heater control signal code also corresponds to the proper center frequency of the optical element 106. Stated differently, the optical element 106 is initially calibrated to the frequency of the optical signal generated by the optical source 104.

At step 904, the control code circuitry 207 determines the optical element 106 center wavelength is not calibrated to the frequency of the optical signal generated by the optical source 104 (step 308). Once the control code circuitry 207 determines calibration is need, the method moves onto step 906.

At step 906, the heater circuitry 208 determines a direction in which the TIA control signal code begins to decrease. For example, if the TIA control signal code is to the left of the local minimum TIA control signal code 1006, the decreasing direction would be to the right. Thus, the heater circuitry 208 would determine the TIA control signal code increases in the increasing direction of the heater control signal code.

At step 908, the heater circuitry 208 determines whether the TIA control signal code begins to increase before the TIA control signal code falls below a concave threshold 1008. The concave threshold 1008 is a pre-determined value. The concave threshold may be equal to or different from the calibration threshold 408. The concave threshold may be greater than or less than the calibration threshold 408. During step 908 the heater circuitry 208 is changing the heater signal control code in direction in which the TIA control signal code is decreasing. If the TIA control signal code begins to increase prior to reaching the concave threshold 1008 (i.e., the TIA control signal code was located between the two maximums), the method proceeds to step 916 and the heater circuitry 208 determines that the optical element 106 center wavelength is calibrated. Then the method returns to step 908.

On the other hand, if the heater circuitry 208 determines that the TIA control signal code decreases past the concave threshold 1008, the heater circuitry 208 will change the heater control signal code in the opposite direction. For example, if the TIA control signal code is to the left of the first maximum TIA control signal code 1004a (outside of the valley), the heater circuitry 208 will decrease the heater control signal code. However, the heater control signal code will fall below the concave threshold 1008 and would not increase again. Once the heater control signal falls below the concave threshold 1008, the heater circuitry 208 will change the heater control signal code in the opposite direction (increase the heater control signal code).

At step 912, the heater circuitry 208 determines the TIA control signal code begins the decrease. The heater circuitry 208 will continue to change the heater control signal code in the same direction after determining the TIA control signal code decreases (i.e., reaches the valley).

At step 914 the heater circuitry 208 determines the TIA control signal code begins to increase again. Here, the method proceeds to step 916, and the heater circuitry 208 determines that the optical element 106 center wavelength is calibrated. At step 916, after determining the optical element 106 is calibrated and the method returns to step 908.

What is claimed is:

1. An integrated circuit (IC) device comprising:
   a controller circuitry having an input coupled to a photodiode of an optoelectronic circuitry and an output coupled to a heater of the optoelectronic circuitry, wherein:
   the controller circuitry is configured to determine a center frequency of the optoelectronic circuitry based on a shape of an input signal received from the photodiode, and provide a heater signal to the heater based on the shape of the input signal and the center frequency of the optoelectronic circuitry; and
   the controller circuitry comprises a control code circuitry configured to calibrate the heater signal to maintain the center frequency of the optoelectronic circuitry to a frequency of the input signal by maintaining a transimpedance (TIA) control signal code, generated by the control code circuitry, within a calibration threshold.

2. The IC device of claim 1, wherein the controller circuitry further comprises a TIA circuitry having a first input coupled to the photodiode and an output coupled to an input of a slicer circuitry, wherein the control code circuitry has an input coupled to an output of the slicer circuitry and is configured to output a TIA control signal to an input of a first digital-to-analog converter (DAC) and a heater control signal to a second DAC;

the TIA circuitry is configured to cancel out a direct current (DC) component of the input signal from the photodiode based on the TIA control signal; and the first DAC is configured to output the heater signal to the heater based on the heater control signal.

3. The IC device of claim 2, wherein the control code circuitry is configured to:

sweep the heater control signal to change a temperature of the heater; and determine at least one maximum TIA control signal code and a maximum heater control signal code that corresponds to the at least one maximum TIA control signal code.

4. The IC device of claim 3, wherein the control code circuitry is configured to determine that the input signal comprises a convex shape or a flat shape based on the input signal having a single maximum TIA control signal code.

5. The IC device of claim 4, wherein the control code circuitry is configured to:

determine a first heater control signal code corresponding to a first TIA control signal code equal to the single maximum TIA control signal code minus a calibration threshold;

determine a second heater control signal code corresponding to a second TIA control signal code equal to the single maximum TIA control signal code minus the calibration threshold; and determine that the input signal has a convex shape based on a difference between the second heater control signal code and the first heater control signal code being less than a flat range threshold.

6. The IC device of claim 5, wherein, the control code circuitry is configured to:

determine that the optoelectronic circuitry requires calibration;

change the heater control signal code in a direction that causes the TIA control signal code to increase; and cease changing the heater control signal code when the TIA control signal code begins to decrease.

7. The IC device of claim 4, wherein the control code circuitry is configured to:

determine a first heater control signal code corresponding to a first TIA control signal code equal to the single maximum TIA control signal code minus a calibration threshold;

determine a second heater control signal code corresponding to a second TIA control signal code equal to the single maximum TIA control signal code minus the calibration threshold; and determine that the input signal has a flat shape based on a difference between the second heater control signal code and the first heater control signal code being greater than a flat range threshold.

8. The IC device of claim 7, wherein the control code circuitry is configured to:

determine that the optoelectronic circuitry requires calibration;

increase or decrease the heater control signal code until the TIA control signal code is equal to the single maximum TIA control signal code minus the calibration threshold; and add or subtract the heater control signal code with the second heater control signal code minus the first heater control signal code.

9. The IC device of claim 3, wherein the control code circuitry is configured to determine the input signal has a concave shape based on determining that the input signal has two maximum TIA control signal codes.

10. The IC device of claim 9, wherein the control code circuitry is further configured to:

determine a first maximum TIA control signal code and a first maximum heater control signal code corresponding to the first maximum TIA control signal code;

determine a second maximum TIA control signal code and a second maximum heater control signal code corresponding to the second maximum TIA control signal code;

determine a local minimum TIA control signal code and a local minimum heater control signal code corresponding to the local minimum TIA control signal code, determine a direction in which the TIA control signal code decreases in response to determining that the optoelectronic circuitry requires calibration;

change the heater control signal code in the direction in which the TIA control signal code decreases until the TIA control signal code increases or the TIA control signal code decreases to less than a concave threshold; and in response to determining that the TIA control signal code decreased to less than the concave threshold, changing the heater control signal code in an opposite direction until the TIA control signal code decreases and then increases again.

11. A controller circuitry comprising:

a control code circuitry comprising:

a TIA control circuitry having an input connected to a photodiode of an optoelectronic circuitry; and a heater circuitry having an input coupled to the TIA control circuitry and an output coupled to a heater of the optoelectronic circuitry, the heater circuitry configured to determine a center frequency of the optoelectronic circuitry and determine a shape of an input signal received from the photodiode based on a TIA control signal code provided by the TIA control circuitry, and maintain the center frequency of the optoelectronic circuitry within a calibration threshold.

12. The controller circuitry of claim 11, wherein the heater circuitry is configured to maintain the center frequency of the optoelectronic circuitry within the calibration threshold by updating a heater control signal code provided to the heater based on the TIA control signal code.

13. The controller circuitry of claim 11, wherein the heater circuitry is configured to determine that the input signal comprises a concave shape, a convex shape, or a flat shape based on a quantity of maximums in the TIA control signal code.

14. A method for operating an integrated circuit device comprising:

determining, by a controller circuitry having an input coupled to a photodiode of an optoelectronic circuitry and an output coupled to a heater of the optoelectronic circuitry, a shape of an input signal received from the photodiode, wherein determining the shape of the input signal comprises:

generating, by a control code circuitry of the controller circuitry, a TIA control signal code and a heater control signal code based on the input signal;

sweeping, by the control code circuitry, the heater control signal code across a search window; and determining, by the control code circuitry, the shape of the input signal based on changes in the TIA control signal code as the control code circuitry sweeps the heater control signal code;

determining, by the controller circuitry, a center frequency of the input signal based on the shape of the input signal; and providing, by the controller circuitry, a heater signal to the heater based on the shape of the input signal and the center frequency of the optoelectronic circuitry.

15. The method of claim 14, further comprising:

determining, by the control code circuitry, that the input signal reaches a single maximum TIA control signal code as the heater control signal code is swept;

determining, by the control code circuitry, a first heater control signal code corresponding to a first TIA control signal code that is equal to the single maximum TIA control signal code minus a calibration threshold;

determining a second heater control signal code corresponding to a second TIA control signal code that is equal to the single maximum TIA control signal code minus the calibration threshold; and determining, by the control code circuitry, that the input signal has a convex shape based on a difference between the second heater control signal code and the first heater control signal code being less than a flat range threshold; or determining, by the control code circuitry, that the input signal has a flat shape based on a difference between the second heater control signal code and the first heater control signal code being greater than the flat range threshold.

16. The method of claim 15, further comprising:

determining, by the control code circuitry, the input signal has a convex shape;

determining, by the control code circuitry, that the input signal requires calibration;

changing, by the control code circuitry, the heater control signal code in a direction that causes the TIA control signal to increase; and ceasing, by the control code circuitry, changing the heater control signal code when the TIA control signal code begins to decrease in response to determining the input signal has a convex shape.

17. The method of claim 15, further comprising:

determining, by the control code circuitry, the input signal has a flat shape;

determining, by the control code circuitry, that the optoelectronic circuitry requires calibration;

increasing or decreasing, by the control code circuitry, the heater control signal code until the TIA control signal code is equal to the single maximum TIA control signal code minus the calibration threshold; and adding or subtracting, by the control code circuitry, the heater control signal code with the second heater control signal code minus the first heater control signal code.

18. The method of claim 14, further comprising determining, by the control code circuitry, the input signal has a concave shape based on determining that the input signal has two maximum TIA control signal codes.

19. The method of claim 18, further comprising:

determining, by the control code circuitry, a first maximum TIA control signal code and a first maximum heater control signal code corresponding to the first maximum TIA control signal code;

determining, by the control code circuitry, a second maximum TIA control signal code and a second maximum heater control signal code corresponding to the second maximum TIA control signal code;

determining, by the control code circuitry, a local minimum TIA control signal code and a local minimum heater control signal code corresponding to the local minimum TIA control signal code, determining, by the control code circuitry, a direction in which the TIA control signal code decreases in response to determining that the optoelectronic circuitry requires calibration;

changing, by the control code circuitry, the heater control signal code in the direction in which the TIA control signal code decreases until the TIA control signal code increases or the TIA control signal code decreases to less than a concave threshold; and in response to determining that the TIA control signal code decreased to less than the concave threshold, changing, by the control code circuitry, the heater control signal code in an opposite direction until the TIA control signal code decreases and then increases again.

* * * * *

UNITED STATES PATENT AND TRADEMARK OFFICE
CERTIFICATE OF CORRECTION

| | | |
|---|---|---|
| PATENT NO. | : 12,072,239 B1 | Page 1 of 1 |
| APPLICATION NO. | : 18/128948 | |
| DATED | : August 27, 2024 | |
| INVENTOR(S) | : Zhaowen Wang et al. | |

It is certified that error appears in the above-identified patent and that said Letters Patent is hereby corrected as shown below:

In the Specification

In Column 1, after Line 4, please insert the following:
--GOVERNMENT RIGHTS
This invention was made with U.S. Government support under Agreement No. HR0011-19-3-0004, awarded by Defense Advanced Research Projects Agency. The U.S. Government has certain rights in the invention.--

Signed and Sealed this
Third Day of December, 2024

*Katherine Kelly Vidal*

Katherine Kelly Vidal
*Director of the United States Patent and Trademark Office*